United States Patent [19]

Hammond et al.

[11] Patent Number: 4,738,875

[45] Date of Patent: Apr. 19, 1988

[54] METHOD OF SCREENING PLASTICS MEMBER FROM ELECTROMAGNETIC INTERFERENCE

[75] Inventors: Colin C. Hammond; Roy E. Meekings, both of Kent, England

[73] Assignee: Deccospray Limited, London, England

[21] Appl. No.: 869,826

[22] Filed: Apr. 30, 1986

Related U.S. Application Data

[63] Continuation of Ser. No. 640,408, Aug. 13, 1984, abandoned.

[30] Foreign Application Priority Data

Aug. 12, 1983 [GB] United Kingdom ............... 8321745

[51] Int. Cl.$^4$ ...................... B05D 3/12; B05D 5/12; B05D 7/22; B05D 1/02
[52] U.S. Cl. .............................. 427/290; 174/35 MS; 427/34; 427/236; 427/272; 427/423; 427/427
[58] Field of Search ............... 427/34, 290, 422, 427, 427/236, 272, 423; 174/35 MS; 51/320, 310–312

[56] References Cited

U.S. PATENT DOCUMENTS 2,516,222  7/1950  Lindmark ..................... 51/320

FOREIGN PATENT DOCUMENTS 54-31479   3/1979  Japan ................................ 427/290
57-140872  8/1982  Japan ................................ 427/34

OTHER PUBLICATIONS

Ingham, H. S. and Shepard, A. P., *Metallizing Handbook*, 7th edition, Westbury, New York, Metallizing Engineering Co., Inc., 1959, pp. B-22 and B-23.

Guralnik, D. B. (editor), "Webster's New World Dictionary of the American Language", New York, The World Publishing Company, 1970, pp. 38, 41, 699, 700.

"Blast Cleaning", technical brochure from Barton Abrasives Ltd., Topton, West Midlands, United Kingdom, 1975, p. 813.

Baumeister et al. (editors), *Marks' Standard Handbook for Mechanical Engineers*, eighth edition, 1978, New York, McGraw-Hill Book Company, pp. 13-70.

*Primary Examiner*—Evan K. Lawrence
*Attorney, Agent, or Firm*—Laubscher & Laubscher

[57] ABSTRACT

A plastics member, such as a container, is provided with an electromagnetic screen by coating the inner surfaces with a film of zinc. The inner surfaces are prepared by shot blasting prior to arc spraying the zinc film and the shot blasting is carried out using G17 chilled iron grit at a pressure of 15 to 20 pounds per square inch.

2 Claims, No Drawings

METHOD OF SCREENING PLASTICS MEMBER FROM ELECTROMAGNETIC INTERFERENCE

This application is a continuation of application Ser. No. 640,408, filed Aug. 11, 1984, now abandoned.

The present invention relates to a method for screening plastics members, such as containers, so as to provide the containers with an adequate radio frequency interference/electromagnetic interference (EMI) screening for equipment housed within the container.

It has long been appreciated that metal boxes provide good EMI screening of the contents of the box. However, it has also long been appreciated that metal boxes tend to lack aesthetic appeal. With the advent of modern plastics materials, boxes have been available which can be specially designed from both a practical and aesthetic point of view. However, the difficulty with plastics boxes is that they do not provide in themselves any EMI screening of the equipment which they contain.

It has previously been proposed to provide the inner surfaces of a plastics container with a sprayed zinc coating in order to produce effective EMI screening. More particularly, it was suggested that the plastics container should be firstly cleaned of all release agents or surface chemicals and then lightly shot blasted with 18 mesh alumina grit prior to application of the sprayed metal coating. We have found this particular technique to be ineffective in use due to the fact that there is an inadequate mechanical bond between the sprayed metal coating and the interior surface of the plastics container.

The present invention provides a method for screening a plastics container which comprises shot blasting the surface of the container to be screened using a conductive grit under a pressure of between 15 and 20 pounds per square inch and then spraying a coating of zinc on to the thus prepared surface until a surface resistance of no more than ½ ohm is achieved.

Preferably, the grit is chilled iron grit and we have found that G17 chilled iron grit provides a particularly effective result.

In order that the present invention be more clearly understood an example of the method will now be given.

An ABS plastics container is firstly prepared by cleaning its inner shaped surface in order to remove all wax and other release agents or surface chemical from the surface or surfaces which will be ultimately coated. The cleaned surface is then shot blasted using G17 chilled iron grit at substantially 20 pounds per square inch pressure until the operator is satisfied that the whole surface has been properly abraded. Thereafter, a pure zinc metal coating is applied to the shot blasted surface using an arc spray apparatus such as that supplied by Messrs. Metallisation Limited. As thin a coating of zinc is applied as possible since it has been found that if too thick a coating is applied then the coating is likely to be stripped from the plastics surface in use. The operator continually tests the surface resistance of the applied coating until the resistance of the coated surface falls to less than ½ ohm.

Plastics materials other than ABS, such as polypropylene and polyethelene may be coated in the above manner with the same grit but with the pressure being varied in the range 15 to 20 pounds per square inch depending on the type of plastics material used and the thickness of the roll of the container.

Preferably, the areas of the container which are not to be spray coated are masked so as to ensure a pleasing effect on the finished product.

It is possible to use a flame spray device for providing the zinc coating in certain circumstances although great care is need to prevent the plastics container warping or twisting.

We claim:

1. A method for providing a plastics member with a metal coating in order to produce an electromagnetic interference screen, comprising the steps of shot blasting a surface of the plastics member using conductive grit at a pressure between 15 and 20 pounds per square inch, and spraying a coating of zinc onto the shot-blasted surface until a surface resistance of no more than one-half ohm is achieved.

2. A method according to claim 1, wherein the conductive grit is chilled iron grit.

* * * * *